(12) United States Patent
Alter

(10) Patent No.: US 7,960,754 B2
(45) Date of Patent: Jun. 14, 2011

(54) DIODE HAVING HIGH BREAKDOWN VOLTAGE AND LOW ON-RESISTANCE

(75) Inventor: Martin Alter, Los Altos, CA (US)

(73) Assignee: Micrel, Inc., San Jose, CA (US)

( * ) Notice: Subject to any disclaimer, the term of this patent is extended or adjusted under 35 U.S.C. 154(b) by 214 days.

(21) Appl. No.: 12/401,586

(22) Filed: Mar. 10, 2009

(65) Prior Publication Data
US 2010/0230774 A1    Sep. 16, 2010

(51) Int. Cl.
*H01L 29/66* (2006.01)
(52) U.S. Cl. .......... 257/109; 257/E29.327; 257/E21.352
(58) Field of Classification Search .................. 257/474, 257/476, E29.338, 109, 212, E29.327, E21.352
See application file for complete search history.

(56) References Cited

U.S. PATENT DOCUMENTS 5,157,537 A * 10/1992 Rosenblatt .................. 359/245
7,064,407 B1 * 6/2006 Mallikarjunaswamy ..... 257/471
* cited by examiner

*Primary Examiner* — Thomas L Dickey
*Assistant Examiner* — Nikolay Yushin
(74) *Attorney, Agent, or Firm* — Patent Law Group LLP

(57) ABSTRACT

A Schottky or PN diode is formed where a first cathode portion is an N epitaxial layer that is relatively lightly doped. An N+ buried layer is formed beneath the cathode for conducting the cathode current to a cathode contact. A more highly doped N-well is formed, as a second cathode portion, in the epitaxial layer so that the complete cathode comprises the N-well surrounded by the more lightly doped first cathode portion. An anode covers the upper areas of the first and second cathode portions so both portions conduct current when the diode is forward biased. When the diode is reverse biased, the depletion region in the central N-well will be relatively shallow but substantially planar so will have a relatively high breakdown voltage. The weak link for breakdown voltage will be the curved edge of the deeper depletion region in the lightly doped first cathode portion under the outer edges of the anode. Therefore, the N-well lowers the on-resistance without lowering the breakdown voltage.

19 Claims, 3 Drawing Sheets

DIODE HAVING HIGH BREAKDOWN VOLTAGE AND LOW ON-RESISTANCE

FIELD OF THE INVENTION

This invention relates to diodes and, in particular, to a technique for reducing the on-resistance of diodes without reducing the breakdown voltage.

BACKGROUND

A conventional Schottky diode 10 is shown in FIG. 1. The anode 12 of the diode 10 may be any one of a variety of metals, such as aluminum. The anode 12 contacts an N-type semiconductor cathode 14, such as an epitaxial layer. An N+ layer 16 provide a contact between a voltage source and the cathode 14. Oxide regions 17 define the edges of the diode 10.

The epitaxial layer cathode 14 has a typical dopant concentration on the order of $1 \times 10^{15}/cm^3$. Typically, various other circuit elements are formed in the same epitaxial layer, such as components for a switching voltage regulator. The diode 10 may be a high power diode for connection to an external inductor in a switching voltage regulator.

When the diode 10 is forward biased, the electrons in the conduction band of the cathode 14 conduct current to the anode 12. Since the cathode is lightly doped, there is a relatively high on-resistance, such as 1 ohm where the distance between the anode 12 and the N+ layer 16 is around 2 microns.

When the diode 10 is reverse biased, a depletion region 18 forms. The depletion region 18 expands as the reverse voltage is increased until there is a breakdown. It is well known that curved edges of the depletion region 18 concentrate the electric field and thus are the weakest links for breaking down. A smaller radius of curvature of the depletion region edge lowers the breakdown voltage. Therefore, a designer of a diode junction for a high voltage application forms the junction with a large radius of curvature so that the depletion region has a correspondingly large radius of curvature. The highest breakdown voltage is achieved with a plane (flat) junction.

In FIG. 1, the curved edge 20 of the depletion region 18 will break down prior to the flat area 22 of the depletion region 18.

By increasing the dopant concentration of the cathode 14, the on-resistance will be lowered but the breakdown voltage will decrease since the depletion region 18 will not go as deep, causing the radius of curvature to decrease. Further, it may not be desirable to increase the dopant concentration in the epitaxial layer, since the layer is used for other components where the epitaxial layer dopant concentration is optimal.

What is needed is a technique to lower the on-resistance of a diode while not lowering the breakdown voltage of the diode or affecting other devices.

SUMMARY

A Schottky or PN diode is formed where a first cathode portion is an N-epitaxial layer that is relatively lightly doped. An N+ buried layer is formed beneath the cathode for conducting the cathode current to a cathode contact. A more highly doped N-well, as a second cathode portion, is formed in the epitaxial layer so that the complete cathode is the N-well surrounded by the N-epitaxial layer. Therefore, the edges of the cathode are lightly doped and the center portion is more heavily doped. An anode covers the top areas of the first cathode portion and the second cathode portion such that a forward current will flow between the anode and the buried layer through both the first cathode portion and the second cathode portion. The center N-well lowers the on-resistance of the diode compared to a diode without the N-well.

The lightly doped edge of the cathode creates a deep depletion region upon the diode being reversed biased. Due to the deepness of the depletion region, the radius of curvature of the depletion region at the outer edge of the cathode (below the edge of the anode) is large so the electric field is not very concentrated by the curvature. However, the curved edge is still the weak link for breaking down since it will break down before a planar depletion region edge will break down. Curved edges typically break down at voltages 30-50% lower than the planar edges. In contrast, in the more highly doped center region (the N-well), the depletion region is relatively shallow but is flat throughout, since it is not below an edge of the anode. The flat shape of the depletion region in the N-well causes the breakdown voltage in the N-well to be at least as high as the breakdown voltage at the outer edges of the cathode.

Therefore, the center N-well does not lower the breakdown voltage yet provides a relatively low resistance path when the diode is turned on. In one embodiment, the N-well lowers the on-resistance by 20%, which results in a huge increase in efficiency in high power applications. In one embodiment, the resulting breakdown voltage is 50 volts.

In one embodiment, the dopant concentration of the first cathode portion is around $1 \times 10^{15}/cm^3$ (arsenic), and the dopant concentration of the center, second cathode portion is around $3 \times 10^{15}/cm^3$ (phosphorus). The center N-well may lower the on-resistance from, for example, one ohm (without the N-well) to 0.8 ohms (with the N-well) with no decrease in the breakdown voltage. In one embodiment, the cathode is about 2 microns deep. Since the on-resistance may be 20% lower, the diode may be formed 20% smaller than the prior art diode (FIG. 1) while achieving the same on-resistance (not considering any effects due to metal resistance).

The anode may be metal (for a Schottky) or may be doped (to form a PN diode). The polarities of the regions and layers described above may be reversed so the cathode is on top and the anode uses a P-type buried layer. If the epitaxial layer is a P-type, the cathode would be formed as a low-doped N-well surrounding a more highly doped central N-well. The diode may also be part of an NPN or PNP bipolar transistor or any other device incorporating a diode junction.

Conventional guard-rings or field-plates around the diode surface periphery may also be used in conjunction with the invention to increase the breakdown voltage.

BRIEF DESCRIPTION OF THE DRAWINGS

Elements in the various figures labeled with the same numeral may be identical.

DETAILED DESCRIPTION

Figure 2:
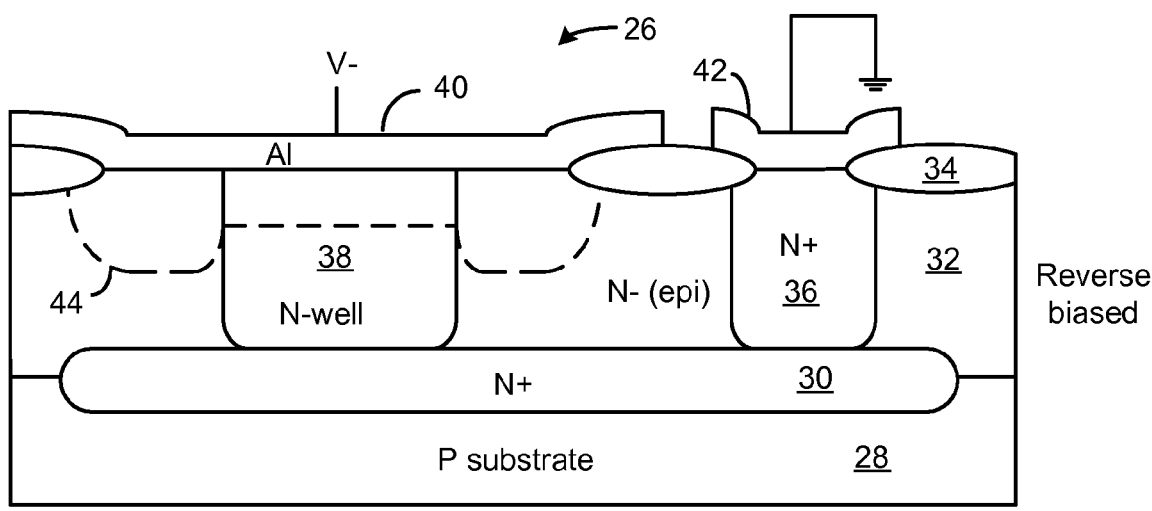
FIG. 2 is a simplified cross-sectional view of a Schottky diode incorporating the present invention.

FIG. 2 illustrates a Schottky diode 26 incorporating the present invention.

To form the diode of FIG. 2, a P-type silicon substrate 28 is masked and doped using conventional techniques to deposit N-type dopants, such as antimony, to form an N+ buried layer 30. Antimony has a slow diffusion rate. In one embodiment, the antimony dose is sufficient to create a buried layer 30 with a resistance of 30 ohms/square.

A standard N-type epitaxial layer 32 is then grown over the silicon substrate 28. The characteristics of the epitaxial layer 32 will typically be determined by the type of process used by the foundry, such as a CMOS process, a BiCMOS process, etc. In one embodiment, the N-type epitaxial layer 32 has a dopant concentration of $1\times10^{15}/cm^3$ (arsenic) and the thickness of the epitaxial layer 32 above the buried layer is about 2 microns.

The surface is then masked, and oxide regions 34 are formed to define openings.

The surface is again masked, and N-type dopants (e.g., phosphorus) are injected to form an N+ sinker 36 extending down to the buried layer 30. If the epitaxial layer 32 is sufficiently thick, an up-down sinker is formed by highly doping the substrate 28 with phosphorus in the area of the sinker 36 so the dopants diffuse upward. Many other sinkers on the wafer may be formed at the same time, such as for collector contacts and other uses.

The surface is again masked, and the N-well 38 dopants (phosphorus) are implanted to form the N-well 38 extending down to the buried layer 30. The N-well 38 may be formed using an up-down process if the epitaxial layer 32 is sufficiently thick. In one embodiment the N-well dopant concentration is $3\times10^{15}/cm^3$ but may be higher or lower (e.g., 2-5 times the epi dopant concentration). An optimal dopant concentration of the N-well 38 for minimal on-resistance and maximum breakdown voltage may be determined by simulation. In one embodiment, other N-wells are formed in the silicon wafer that are used to form the body region of P-channel MOSFETs (in a CMOS process), where all the N-wells have the same dopant concentration of $3\times10^{15}/cm^3$. Therefore, forming the cathode N-well 38 requires no extra process steps.

In one embodiment, the area of the N-well 38 takes up about 80% of the area of the cathode, with only 10% of the epitaxial layer 32 forming the edge of the cathode around the central N-well 38. In another embodiment, the N-well 38 takes up 50-80% of the cathode surface area and may have a doping concentration about 2-5 times that of the surrounding cathode material, depending on the thickness of the cathode and the doping concentration of the epitaxial layer. In one embodiment, the N-well 38 is substantially rectangular with rounded edges, but the N-well 38 can be circular, oval, or another shape.

A Schottky metal anode 40 is then deposited over the exposed surface to contact the epitaxial layer 32 and the central N-well 38 to form the Schottky contact. Many types of metals may be used, such as Al, AlSi, AlSiCu, TiSi2, CoSi, etc., and aluminum is used herein as an example. A metal interface layer may be deposited prior to the thick aluminum layer. The aluminum also forms a cathode contact 42. The metal is then etched to define the metal regions.

FIG. 2 shows voltages applied to the diode to reverse bias the diode, such as when an inductor of a switching voltage regulator is charging and the diode decouples the inductor from ground. The general shape of the resulting depletion region edge 44 is shown in dashed outline. The depletion region edge 44 curves upward in the cathode near the edge of the anode 40. Curved edges of a depletion region are the weak points for breakdown due to their focusing of the electric field. The curved edges may have a breakdown voltage that is about 50-70% the breakdown voltage of the planar edges of the depletion region.

The depletion region edge in the N-well 38 is a plane so the breakdown voltage within the N-well 38 is relatively high, and an optimized N-well 38 size and doping concentration will result in the breakdown voltage in the N-well 38 being similar to the breakdown voltage within the epitaxial layer 32 to provide the lowest on-resistance with no penalty in breakdown voltage.

Figure 1:
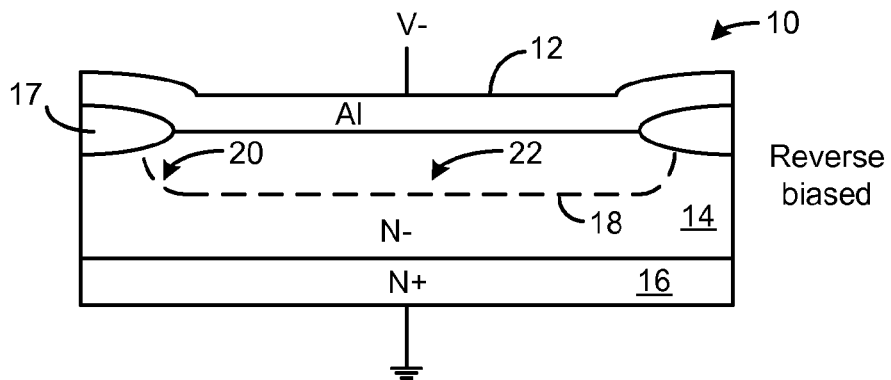
FIG. 1 is a simplified cross-sectional view of a prior art Schottky diode.

Forward biased conduction of the diode is through both the epitaxial layer 32 and N-well 38 in parallel. A forward bias voltage will typically be between 0.15 and 0.45 volts for a Schottky diode. A diode used in a power application may need to conduct as much as 5 A of current, so any reduction in on-resistance provides a large improvement in efficiency. The center N-well 38 may lower the on-resistance from, for example, 1 ohm (without the N-well) to 0.8 ohms (with the N-well) with no decrease in the breakdown voltage. Since the on-resistance may be 20% lower, the diode may be formed 20% smaller than the prior art diode (FIG. 1) while achieving the same on-resistance (does not take into effect any metal parasitic resistance).

Figure 3:
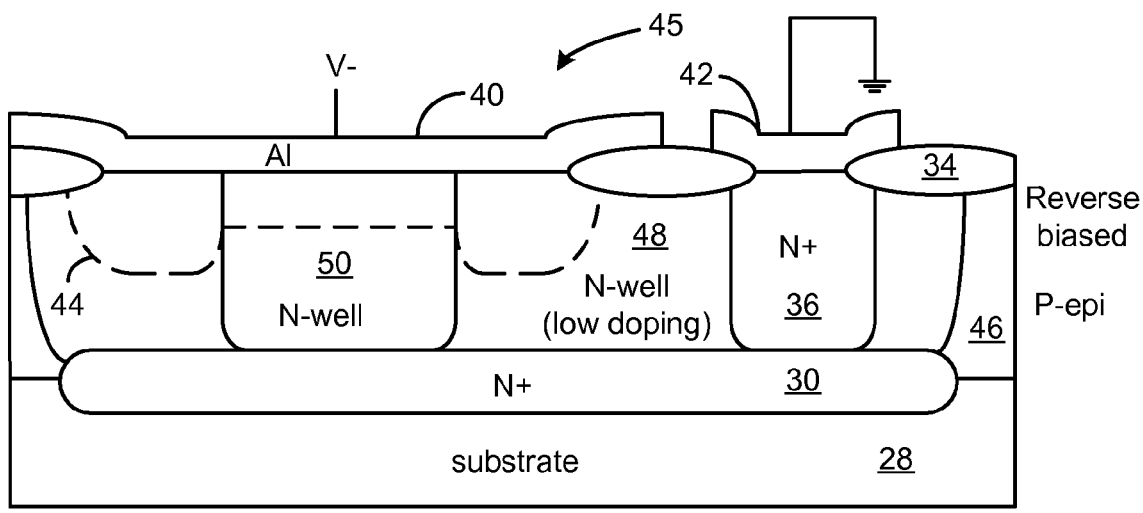
FIG. 3 is similar to FIG. 2 but with a P-type epitaxial layer and the low-dopant outer cathode portion formed as a large N-well.

In another embodiment of a diode 45, shown in FIG. 3, the epitaxial layer 46 is a P-type and the outer cathode portion is formed by a relatively large N-well 48 formed in the P-type layer. A more highly doped N-well 50 (similar to N-well 38 in FIG. 2) is then formed in the center of the lower doped N-well 48. The doping concentrations may be the same as discussed with respect to FIG. 2. The performance will be similar to that shown in FIG. 2.

As in all embodiment, the center N-well does not have to contact the buried layer to achieve an improvement in on-resistance. However, a maximum reduction in on-resistance is achieved by the deepest N-well.

Figure 4:
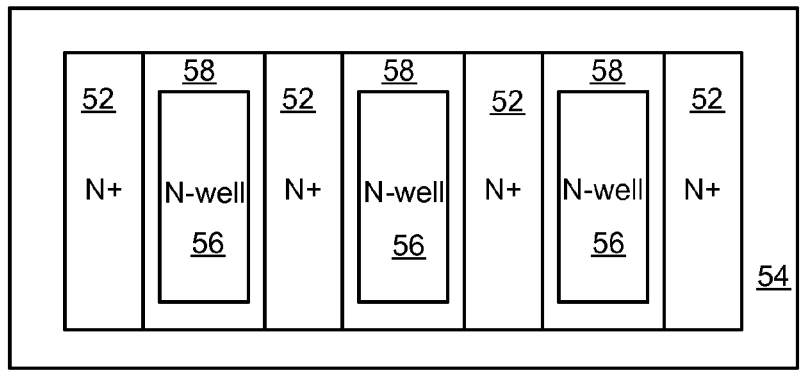
FIG. 4 is a top down view of a parallel bank of diodes, effectively forming a single high power diode, with the anode not shown, where each cathode includes a center N-well to reduce on-resistance.

FIG. 4 is a simplified top down view of a bank of parallel-connected diodes, where each diode is bounded by N+ sinkers 52 extending down to an N+ buried layer 54. The cathode contact and anode are not shown. The parallel diodes effectively form a single high power diode. The relatively highly doped N-wells 56 (similar to N-well 38 in FIG. 2) are formed within the more lightly doped cathode region 58, which may be an N-well or an N-epitaxial layer. In one embodiment, about 20% of the cathode area surrounds the center N-well 56 (10% on each side). The anode and cathode metal interconnects the diodes together to create a high power diode.

The diode may also be a single low-power diode such as an anti-saturation clamp for a bipolar transistor.

The polarities may be reversed for a diode where the P-type anode is formed as the bottom of the diode. All polarities shown in the various figures would be reversed. The P-type dopant would normally be boron.

Figure 5:
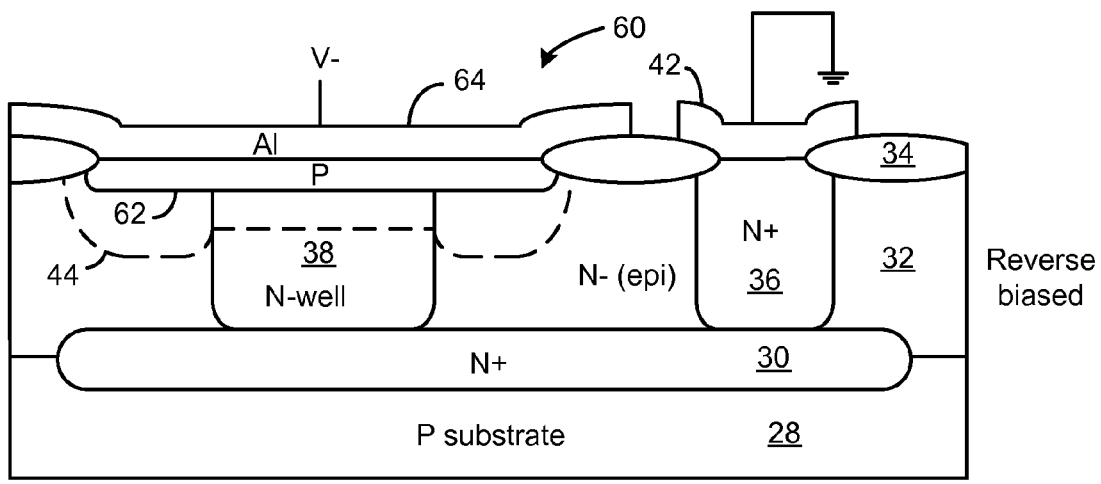
FIG. 5 is a simplified cross-sectional view of a PN diode incorporating the present invention.

FIG. 5 illustrates a PN diode 60, where all elements are similar to the Schottky diode 26 of FIG. 2 except the anode is a P-type region 62, and the metal anode contact 64 contacts the P-type region 62.

Figure 6:
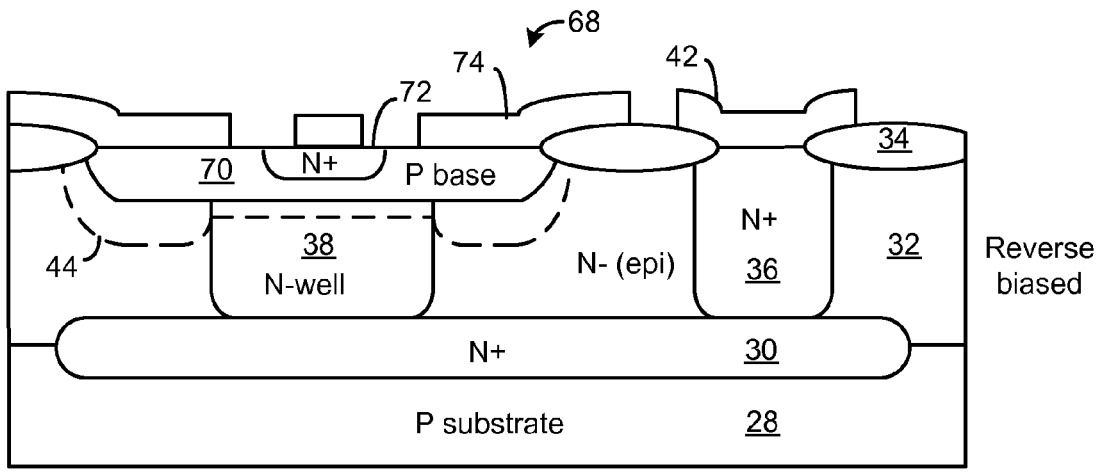
FIG. 6 is a simplified cross-sectional view of an NPN transistor, where the collector incorporates the present invention.
Figure 7:
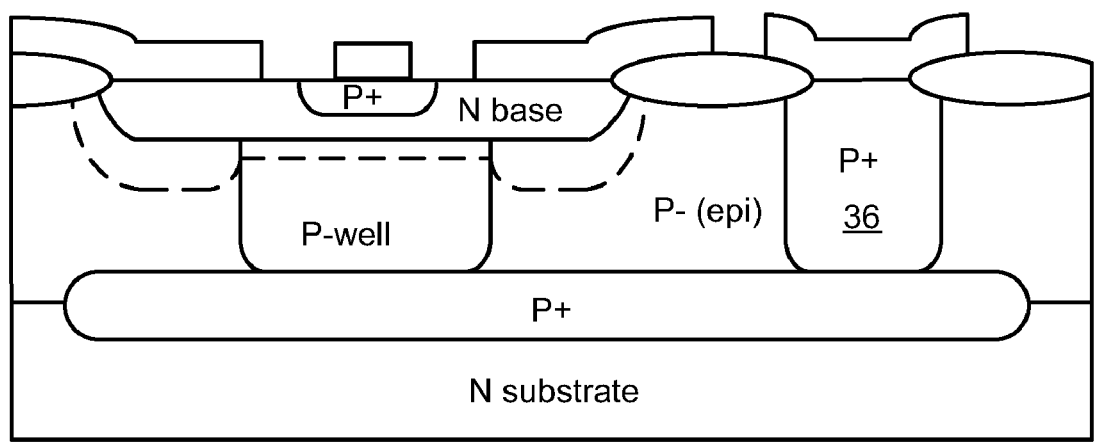
FIG. 7 is a simplified cross-sectional view of a PNP transistor, where the collector incorporates the present invention.

FIG. 6 illustrates the invention applied to the base/collector diode in an NPN transistor 68. The collector forms the cathode of the diode, similar to the diode in FIG. 5. In FIG. 6, a P-type base 70 is formed in the N-type epitaxial layer 32, and an N+ emitter 72 is formed in the base 70. The collector is formed by the epitaxial layer 32, N-well 38, and N+ sinker 36. A metal layer 74 forms contacts to the various doped regions. All polarities may be reversed for a PNP transistor, as shown in FIG. 7.

The figures eliminate, for simplicity, conventional features, such as guard-rings or field-plates around the diode surface periphery, that are known to increase the breakdown voltage of a diode. Such conventional features may be used in conjunction with the invention to further increase the breakdown voltage of the diode. The diode may also be surrounded by isolation regions to isolate the diode from other components and mitigate the effects of any parasitic transistors.

The inventive technique may also be applicable to diodes formed of SiC or other semiconductor materials.

Having described the invention in detail, those skilled in the art will appreciate that, given the present disclosure, modifications may be made to the invention without departing from the spirit and inventive concepts described herein. Therefore, it is not intended that the scope of the invention be limited to the specific embodiments illustrated and described.

What is claimed is:

1. A diode comprising:
    a first cathode portion in a semiconductor material, the first cathode portion having a first dopant concentration of an N type;
    a second cathode portion in the semiconductor material surrounded by the first cathode portion, the second cathode portion having a second dopant concentration of the N type higher than the first dopant concentration, the first cathode portion forming an outer edge of the diode's cathode;
    an N-type buried layer directly below the first cathode portion and the second cathode portion to conduct current through the first cathode portion and the second cathode portion, the N-type buried layer leading to a cathode contact; and
    an anode formed over and contacting the first cathode portion and the second cathode portion, wherein, when the diode is forward biased, current flows between the anode and the buried layer through the first cathode portion and the second cathode portion, the second cathode portion lowering an on-resistance of the diode by being more highly doped than the first cathode portion.

2. The diode of claim 1 wherein, upon the diode being reverse biased, a depletion region forms in the first cathode portion and the second cathode portion such that the depletion region curves in the first cathode portion near an edge of the anode but is substantially planar in the second cathode portion.

3. The diode of claim 1 wherein the second dopant concentration is at least double the first dopant concentration.

4. The diode of claim 1 wherein the second dopant concentration is at least three times the first dopant concentration.

5. The diode of claim 1 wherein the first cathode portion is an N-type epitaxial layer, and the second cathode portion is an N-well formed in the epitaxial layer.

6. The diode of claim 1 wherein the diode is a Schottky diode, and the anode is a metal layer directly contacting a surface of the first cathode portion and the second cathode portion.

7. The diode of claim 1 wherein the diode is a PN diode, and the anode is a P-type region contacting an upper area of the first cathode portion and the second cathode portion.

8. The diode of claim 1 wherein the diode is a junction in a bipolar transistor.

9. The diode of claim 1 wherein the diode comprises a plurality of identical diodes connected in parallel, the diodes being separated by N+ sinker regions, extending to the N-type buried layer, separating the first cathode portion of one diode from the first cathode portion of an adjacent diode.

10. The diode of claim 1 wherein the second cathode portion directly contacts the N-type buried layer.

11. The diode of claim 1 wherein the diode is formed in a silicon wafer that includes CMOS transistors, the second cathode portion having the same second dopant concentration as N-wells form in the wafer used as body regions for P-channel MOSFETs so that the second cathode portion and the N-wells are formed at the same time.

12. A diode comprising:
    a first anode portion in a semiconductor material, the first anode portion having a first dopant concentration of a P type;
    a second anode portion in the semiconductor material surrounded by the first anode portion, the second anode portion having a second dopant concentration of the P type higher than the first dopant concentration, the first anode portion forming an outer edge of the diode's anode;
    a P-type buried layer directly below the first anode portion and the second anode portion to conduct current through the first anode portion and the second anode portion, the P-type buried layer leading to an anode contact; and
    an N-type cathode formed over and contacting the first anode portion and the second anode portion, wherein, when the diode is forward biased, current flows between the cathode and the buried layer through the first anode portion and the second anode portion, the second anode portion lowering an on-resistance of the diode by being more highly doped than the first anode portion.

13. The diode of claim 12 wherein, upon the diode being reverse biased, a depletion region forms in the first anode portion and the second anode portion such that the depletion region curves in the first anode portion near an edge of the cathode but is substantially planar in the second anode portion.

14. The diode of claim 12 wherein the second dopant concentration is at least double the first dopant concentration.

15. The diode of claim 12 wherein the second dopant concentration is at least three times the first dopant concentration.

16. The diode of claim 12 wherein the first anode portion is a P-type epitaxial layer, and the second anode portion is a P-well formed in the epitaxial layer.

17. The diode of claim 12 wherein the diode is a junction in a bipolar transistor.

18. The diode of claim 12 wherein the diode comprises a plurality of identical diodes connected in parallel, the diodes being separated by P+ sinker regions, extending to the P-type buried layer, separating the first anode portion of one diode from the first anode portion of an adjacent diode.

19. The diode of claim 12 wherein the second anode portion directly contacts the P-type buried layer.

* * * * *